United States Patent
Mehdizad Taleie et al.

(10) Patent No.: US 10,686,476 B1
(45) Date of Patent: Jun. 16, 2020

(54) DIGITAL RF-DAC

(71) Applicant: QUALCOMM Incorporated, San Diego, CA (US)

(72) Inventors: Shahin Mehdizad Taleie, San Diego, CA (US); Nitz Saputra, Burlingame, CA (US); Chen Jiang, Davis, CA (US); Behnam Sedighi, La Jolla, CA (US); Ibrahim Ramez Chamas, Carlsbad, CA (US); Bhushan Shanti Asuri, San Diego, CA (US); Dongwon Seo, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/417,455

(22) Filed: May 20, 2019

(51) Int. Cl.
| | |
|---|---|
| *H04B 1/04* | (2006.01) |
| *H03M 3/00* | (2006.01) |
| *H03M 1/66* | (2006.01) |
| *H04L 25/49* | (2006.01) |
| *H03F 3/24* | (2006.01) |

(52) U.S. Cl.
CPC ............ *H04B 1/0475* (2013.01); *H03F 3/24* (2013.01); *H03M 1/661* (2013.01); *H03M 1/665* (2013.01); *H03M 3/504* (2013.01); *H04L 25/4921* (2013.01); *H04B 2001/0416* (2013.01)

(58) Field of Classification Search
CPC ........... H04L 27/32; H04L 27/36; H04B 1/04; H04B 1/0475; H03M 3/504; H03M 1/661; H03M 1/665
USPC ................................................ 341/140–148
See application file for complete search history.

(56) References Cited

U.S. PATENT DOCUMENTS

| 6,178,207 B1* | 1/2001 | Richards ................... G01S 5/14 |
| | | 342/450 |
| 6,339,621 B1* | 1/2002 | Cojocaru ............... H04L 27/362 |
| | | 375/247 |
| 7,042,862 B1* | 5/2006 | Hirade ................. H04B 1/7075 |
| | | 370/335 |
| 7,327,803 B2* | 2/2008 | Sorrells .................... H03C 5/00 |
| | | 375/294 |
| 9,705,515 B1* | 7/2017 | Lee .......................... H03L 7/18 |
| 10,305,522 B1* | 5/2019 | Asuri ...................... H03F 3/211 |
| 2010/0328127 A1* | 12/2010 | Sampath ................. H03M 1/66 |
| | | 341/144 |

(Continued)

FOREIGN PATENT DOCUMENTS

WO    2018220035 A1    12/2018

OTHER PUBLICATIONS

Jankunas B., "Design and Calibration of a 12-Bit Current-Steering DAC Using Data-Interleaving," A Thesis Presented in Partial Fulfillment of the Requirements for the Degree Master of Science, Arizona State University, Dec. 2014, 71 pages.

(Continued)

*Primary Examiner* — Lam T Mai
(74) *Attorney, Agent, or Firm* — Haynes and Boone, LLP/QUALCOMM Incorporated (57) ABSTRACT

An RF-DAC transmitter is provided that includes an in-phase channel, a quadrature-phase channel, a first intermediate-phase channel, and a second intermediate-phase channel. Each channel includes a pair of interleaved RF-DACs for producing a pair of interleaved RF signals and a subtractor.

20 Claims, 7 Drawing Sheets

(56) References Cited

U.S. PATENT DOCUMENTS

| | | | | |
|---|---|---|---|---|
| 2011/0002366 A1* | 1/2011 | Michaels | ............. | H04B 1/7115 |
| | | | | 375/148 |
| 2011/0004792 A1* | 1/2011 | Michaels | ............. | H04B 1/7073 |
| | | | | 714/701 |
| 2011/0019719 A1* | 1/2011 | Michaels | ............... | H04B 1/707 |
| | | | | 375/142 |
| 2012/0224662 A1* | 9/2012 | Wakizaka | ........... | H04L 25/0204 |
| | | | | 375/346 |
| 2015/0172608 A1* | 6/2015 | Routhier | ................ | H04N 9/097 |
| | | | | 348/265 |
| 2019/0222179 A1* | 7/2019 | Doi | ....................... | H03F 1/3258 |

OTHER PUBLICATIONS

Mehrpoo M., et al., "A Wideband Linear Direct Digital RF Modulator using Harmonic Rejection and I/O-Interleaving RF DACs", RMO3B-1, IEEE Radio Frequency Integrated Circuits Symposium, 2017, pp. 188-191.

* cited by examiner

DIGITAL RF-DAC

TECHNICAL FIELD

This application relates to radio frequency (RF) mixers, and more particularly to an RF digital-to-analog converter (RF-DAC) that obviates the need for an analog mixer.

BACKGROUND

A conventional transmitter with a Cartesian modulator typically performs the up-conversion on the baseband signals using analog mixers. In an-in-phase (I) channel for such a transmitter, an in-phase digital-to-analog converter (DAC) converts the in-phase digital baseband data signal into an analog in-phase waveform. An in-phase bandpass filter filters the analog in-phase waveform to produce a filtered in-phase data stream that is up-converted by an in-phase mixer. The in-phase mixer mixes the filtered in-phase waveform with a local oscillator (LO) clock signal to produce a radio frequency (RF) in-phase signal. The quadrature-phase (Q) channel for the transmitter is analogous and thus has its own DAC, filter, and mixer. In both channels, the filters and mixers are analog circuits whereas the DACs are partial digital circuits.

Figure 1:
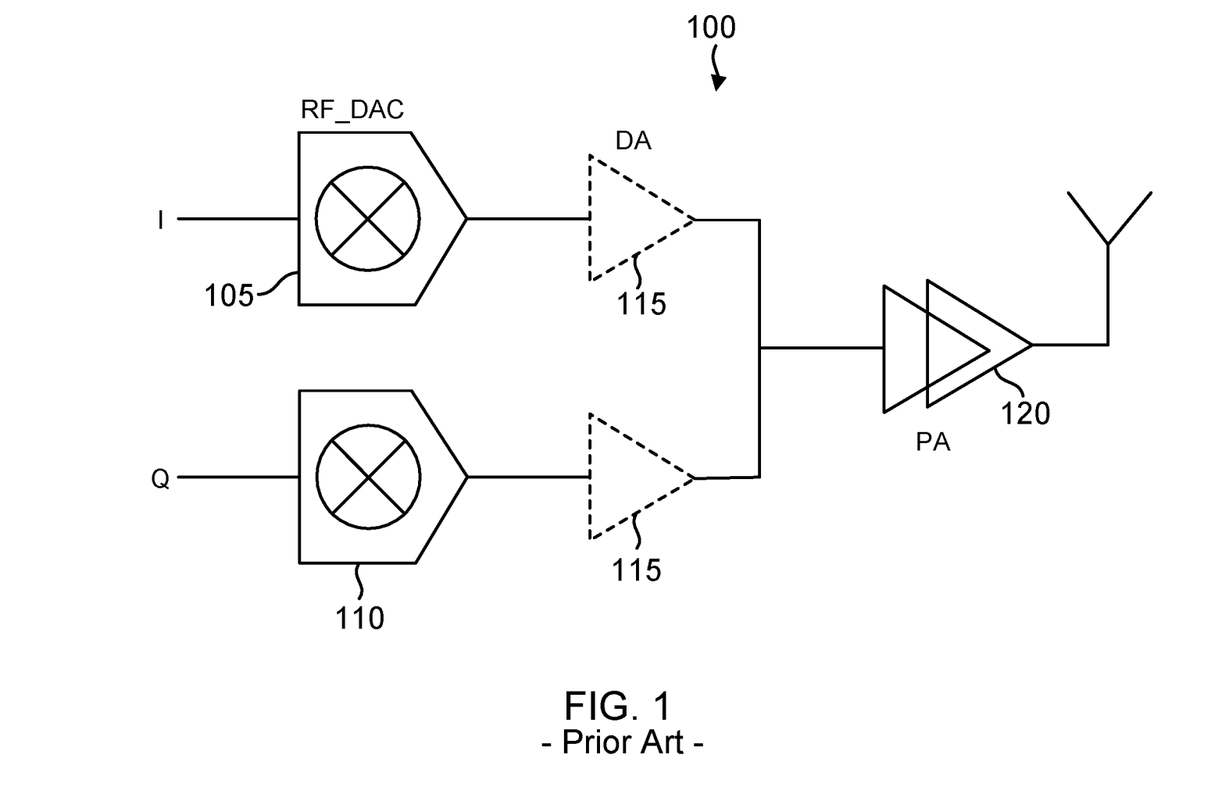
FIG. 1 illustrates a conventional direct-digital RF-DAC transmitter.

This mix of analog and digital circuits has significant consequences in porting a transmitter design from one process node to another as transistors are further miniaturized. In general, a digital circuit design may be ported to new process nodes without considerable re-design whereas an analog circuit typically requires significant re-design to be ported to such new process nodes. Moreover, the transistors in analog circuits are often difficult to scale down without affecting performance, which results in the analog circuits demanding larger die space as compared to digital circuits. In addition, digital circuits typically benefit from scaling and consume less power than comparable analog circuits. To minimize the need for analog circuits, digitally-intensive transmitters have been developed using RF-DACs. An RF-DAC is a DAC that not only converts a baseband signal into an analog signal but also up-converts the baseband signal into an RF analog signal. An RF-DAC thus not only performs the function of the DAC in a conventional transmitter but also performs the function of the mixer. An example, an RF-DAC-based transmitter 100 is shown in FIG. 1. An in-phase (I) RF-DAC 105 converts an in-phase baseband data stream into an analog in-phase RF signal. Similarly, a quadrature (Q) RF-DAC converts a quadrature baseband data stream into an analog quadrature RF signal. Optional driver amplifiers 115 may amplify the analog I and Q RF signals prior to their combination into an RF output signal amplified by a power amplifier 120. Although such a direct-digital transmitter architecture advantageously eliminates the conventional need for analog mixers and filters, the resulting RF output signal from transmitter 100 will generally suffer from insufficient image suppression and excessive distortion.

Accordingly, there is a need in the art for improved RF-DAC transmitters with improved image rejection and reduced distortion.

SUMMARY

An RF-DAC transmitter is disclosed having four channels, each channel including an interpolating DAC formed by an interleaved pair of RF-DACs. The four channels include an in-phase channel, a quadrature-phase channel, a first intermediate-phase channel, and a second intermediate-phase channel. The in-phase channel converts an in-phase baseband digital data signal into a first analog RF signal. Similarly, the quadrature-phase channel converts a quadrature-phase baseband digital data signal into a second analog RF signal. The first intermediate-phase channel converts a first intermediate-phase baseband digital data signal into a third analog RF signal. Similarly, the second intermediate-phase channel converts a second intermediate-phase baseband digital data stream into a fourth analog RF signal. An adder sums the first analog RF signal, the second analog RF signal, the third analog RF signal, and the fourth analog RF signal to form an RF output signal for the RF-DAC transmitter.

Although there are four baseband input digital data streams for the four channels, it is just the in-phase baseband digital data stream and the quadrature-phase baseband digital data streams that are independent baseband signals. The first and second intermediate-phase baseband digital data streams are interpolated from the in-phase and quadrature-phase baseband digital data streams.

The interleaving in each channel substantially eliminates the even harmonics of the RF image and the even harmonics of the baseband signal. In addition, the adding of the four channels' RF signals substantially eliminates the third harmonics of the baseband signal as generated by the RF-DAC nonlinearities and substantially eliminates the third and fifth harmonics of the RF image. The resulting all-digital RF transmitter thus has an advantageously low level of distortion. These and other advantageous features may be better appreciated through the following detailed description.

BRIEF DESCRIPTION OF THE DRAWINGS

Implementations of the present disclosure and their advantages are best understood by referring to the detailed description that follows. It should be appreciated that like reference numerals are used to identify like elements illustrated in one or more of the figures.

DETAILED DESCRIPTION

To improve image rejection and decrease distortion, a Cartesian direct-digital RF-DAC transmitter is disclosed that includes four interpolating RF-DACs. As is conventional in any Cartesian-based transmitter, the RF-DAC-based transmitter upconverts a digital in-phase (I) baseband data stream and also a digital quadrature-phase (Q) baseband data stream into a combined analog RF signal. Although there are thus just two independent input data streams, a data phase interpolator phase shifts the I and Q baseband data streams to produce an I_45 baseband data stream and a Q_45 baseband data stream. The I_45 baseband data stream is shifted in phase by 45 degrees with respect to the I baseband data stream. Similarly, the Q_45 baseband data stream is shifted in phase by 45 degrees with respect to the Q baseband data stream. The RF-DAC transmitter upconverts the resulting four input baseband data streams.

From the four input baseband data streams, each interpolating RF-DAC upconverts its own corresponding baseband signal. Each interpolating RF-DAC includes a pair of interleaved RF-DACs (e.g., a pair of interleaved mixed-mode RF-DACs). The two interleaved RF-DACS are clocked 180° out of phase relative to each other.

Since there are four input baseband data streams, there are four pairs of interleaved RF-DACs. There is thus an in-phase interpolating DAC formed by a first pair of interleaved RF-DACs that upconverts the in-phase baseband data stream, a quadrature-phase interpolating DAC formed by a second pair of interleaved RF-DACs that upconverts the quadrature-phase baseband data stream, an I_45 interpolating DAC formed by a third pair of interleaved RF-DACs that upconverts the I_45 baseband data stream, and a Q_45 interpolating DAC formed by a fourth pair of interleaved RF-DACs that upconverts the Q_45 baseband data stream. For each interleaved RF-DAC, an interpolating finite impulse response (FIR) digital filter filters the corresponding baseband input data stream. There are thus eight FIR digital filters corresponding to the eight interleaved RF-DACs.

The resulting RF-DAC transmitter is quite advantageous because the addition of the output signals to form a combined RF analog signal from the I, I_45, Q, and Q_45 channels substantially cancels the third harmonic of the baseband signal as generated by the DAC's non-linearity distortion. Furthermore, the RF-DAC transmitter cancels the third and fifth harmonics of the RF image that would otherwise be produced in the up conversion of the input sinusoids in the baseband data stream. Within each channel, the interleaved RF-DACs and the interpolating FIRs substantially cancel the even harmonics of the RF image as well as the even harmonics for the baseband signal. The resulting analog RF signal produced by such an all-digital direct-conversion transmitter architecture is thus substantially free of distortion. Moreover, the all-digital nature of such an architecture leads to a very dense and low-power design that is readily ported and downscaled to new process nodes. An example transmitter will now be described in more detail.

Figure 2A:
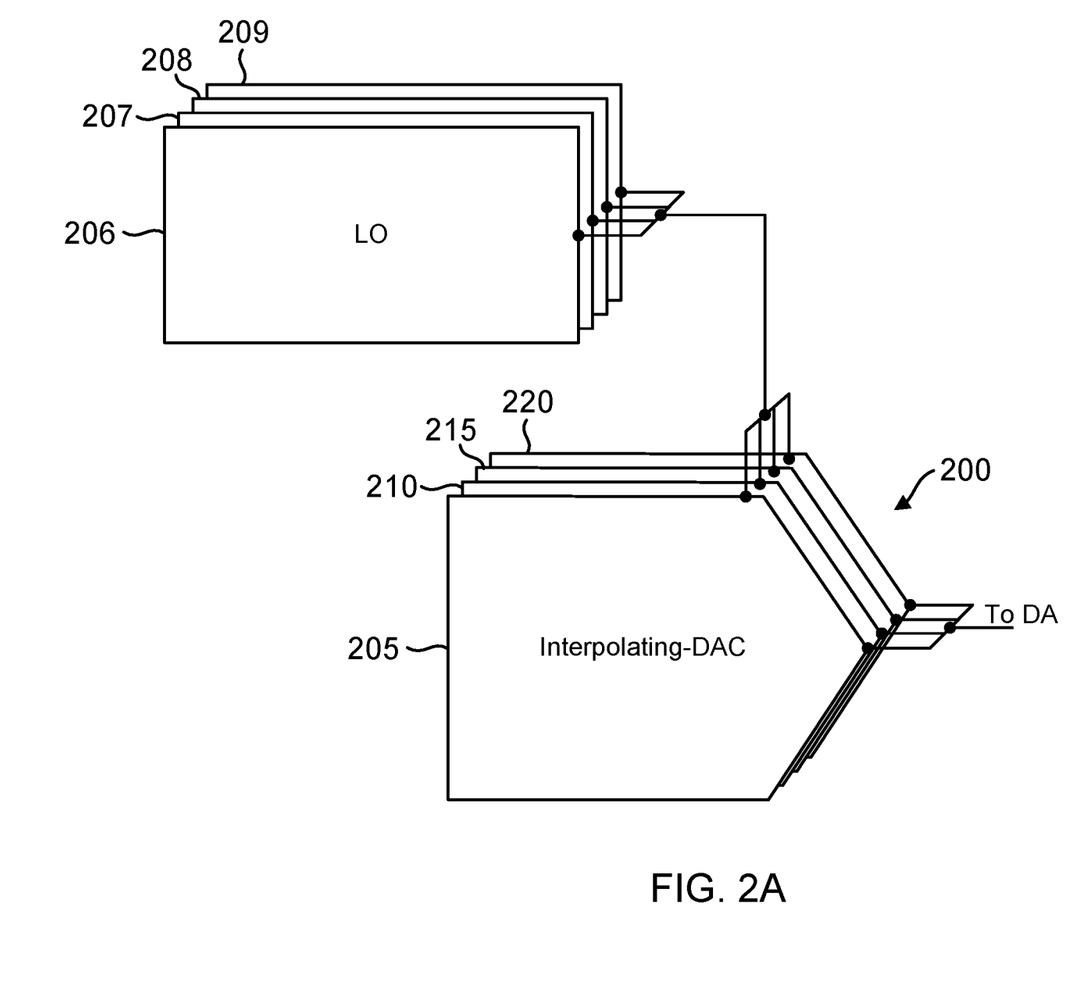
FIG. 2A illustrates a multi-phase RF-DAC transmitter in accordance with an aspect of the disclosure.

An example RF-DAC transmitter 200 is shown in FIG. 2A. An I channel interpolating DAC 205 upconverts an I baseband input data stream (also designated herein as din_0) responsive to an in-phase local oscillator (LO) clock signal from an in-phase LO clock source 206 to produce an I channel analog RF output signal. Similarly, a Q channel interpolating DAC 215 upconverts a Q baseband input data stream (designated herein as din_90) responsive to a quadrature-phase LO clock signal from a quadrature-phase LO clock source 208 to produce a Q channel analog RF output signal. In addition, an I_45 channel interpolating DAC 210 upconverts an I_45 baseband input data stream (designated as din 45) responsive to an I_45-phase LO clock signal from an I_45-phase LO clock source 207 to produce an I_45 channel analog RF output signal. Finally, a Q_45 channel interpolating DAC 220 upconverts a Q_45 baseband input data stream (designated as din_135) responsive to a Q_45-phase LO clock signal from a Q_45-phase LO clock source 209 to produce a Q_45 channel analog RF output signal.

Within each channel, the analog RF output signal may be single-ended voltage or current signal or may instead be a differential voltage or current signal. In the following discussion, it will be assumed that each RF output signal is a differential current signal without loss of generality.

Figure 2B:
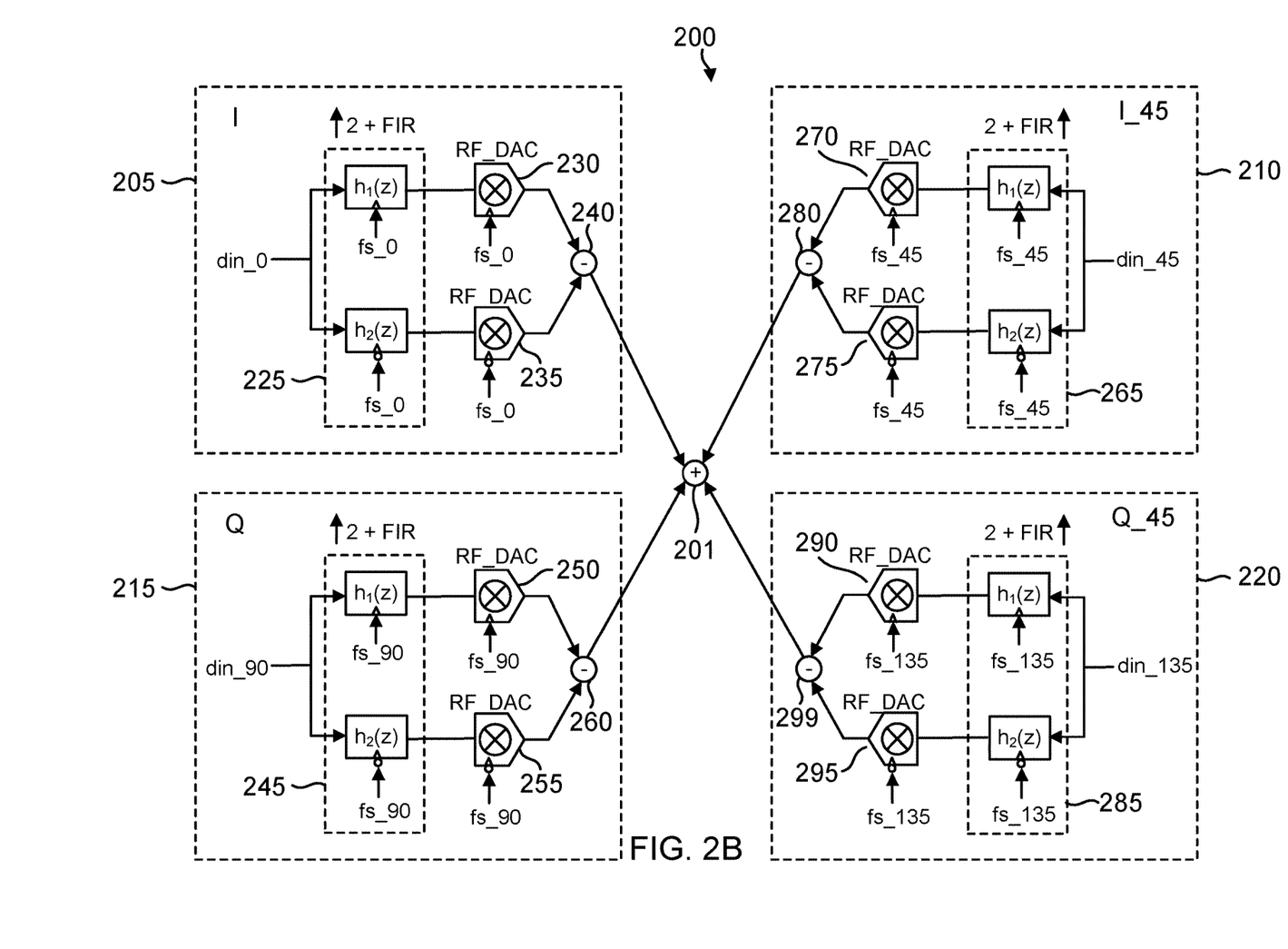
FIG. 2B is a more detailed illustration of the multi-phase RF-DAC transmitter of FIG. 2A.

RF-DAC transmitter 200 is shown in more detail in FIG. 2B. The LO clock sources are not shown in FIG. 2B for illustration clarity. The architecture of each channel is analogous. For example, within I channel interpolating DAC 205 a pair of interleaved RF-DACs 230 and 235 each upconverts an interpolated and filtered digital signal from a corresponding pair of interpolating FIR filters 225. A FIR filter in the pair of FIR filters 225 as represented by its impulse response $h_1(z)$ interpolates and filters the din_0 baseband input data stream responsive to the rising edges of the in-phase local oscillator clock signal (fs_0). Similarly, a remaining FIR filter in the pair of FIR filters 225 as represented by the impulse response $h_2(z)$ filters and interpolates the din_0 baseband input data stream responsive to the falling edges of the in-phase local oscillator clock signal (fs_0). The interpolation by FIR filters 225 allows the local oscillator clock signal to be twice the baseband data rate. One FIR filter in the pair of FIR filters 225 may be designated as a first FIR filter. Similarly, a remaining FIR filter in the pair of FIR filters 225 may be designated as a second FIR filter. The frequency response of the FIR filters 225 reduces aliasing in the resulting RF signal from transmitter 200 and also compensates for the non-uniform frequency response of the RF-DACs.

The interpolation by FIR filters 225 depends upon the local oscillator clock frequency relationship to the baseband data rate. For example, if the baseband digital samples are arriving at a 1 GHz sample rate, the in-phase local oscillator clock signal would be 2 GHz. In alternative embodiments, other up-sampling ratios such as four times the data rate, eight times the data rate and so on may be used depending upon the output frequency requirements. An RF-DAC 230 upconverts the filtered output signal from the $h_1(z)$ FIR responsive to the rising edges of the in-phase local oscillator clock signal to form a first RF analog signal received at an adder 240. Similarly, RF-DAC 235 upconverts the filtered output signal from the $h2(z)$ FIR responsive to the falling edges of the in-phase local oscillator clock signal to form a second RF analog signal received at adder 240 (which is also denoted herein as a subtractor 240). Due to the 180° phase shift between the clocking of RF-DAC 230 and RF-DAC 235, there is a corresponding 1800 phase shift between their outputs at RF (the LO frequency+/−the baseband frequency for the baseband data). Subtractor 240 forms the difference between the first and second RF analog signals to produce an I channel analog RF output signal so that the RF signal does not cancel. In contrast, the baseband signal and the even harmonics will cancel due to the subtraction.

I channel interpolating DAC 205 thus upconverts the input baseband signal to RF at twice the baseband data rate. The data rate for the input baseband signal is half the local oscillator clock signal frequency, which is advantageous with respect to conserving power yet achieving a relatively high RF frequency for the resulting RF output signal from transmitter 200. To achieve an even higher RF frequency, RF-DACs 230 and 235 are each a mixed-mode DAC (return-to-complement) DAC in which the reconstruction waveform equals +1 over the first half of an output sample period and equals −1 over the remaining final half of the output sample period. The frequency domain representation of such a reconstruction waveform has a maximum response in the second Nyquist zone about the local oscillator frequency (fs). In contrast, a zero-order hold DAC has its maximum response in the first Nyquist zone at one-half (fs/2) of the local oscillator frequency. However, it will be appreciated that zero-order hold DACs (or return to zero) DACs may be used in alternative embodiments depending upon the frequency requirements for the output RF signal. The following discussion will assume without loss of generality that the DACs within transmitter 200 are mixed-mode DACs.

The interpolation in FIR filters 225 results in an effective sampling frequency that is twice the data rate for the input baseband data stream. The peak frequency response for the RF signal from I channel interpolating DAC 205 is thus at twice the data rate, which is advantageous for relatively high frequency applications. The impulse responses $h_1(z)$ and $h_2(z)$ for FIR filters 225 are configured to substantially reduce the RF image for the output sinusoids. These impulse responses may be the same or may be different depending upon the design needs. In addition, the interleaving of DACs 230 and 235 combined with the subtraction performed in adder 240 substantially eliminates the even harmonics and baseband image from I channel interpolating DAC 205.

Figure 2C:
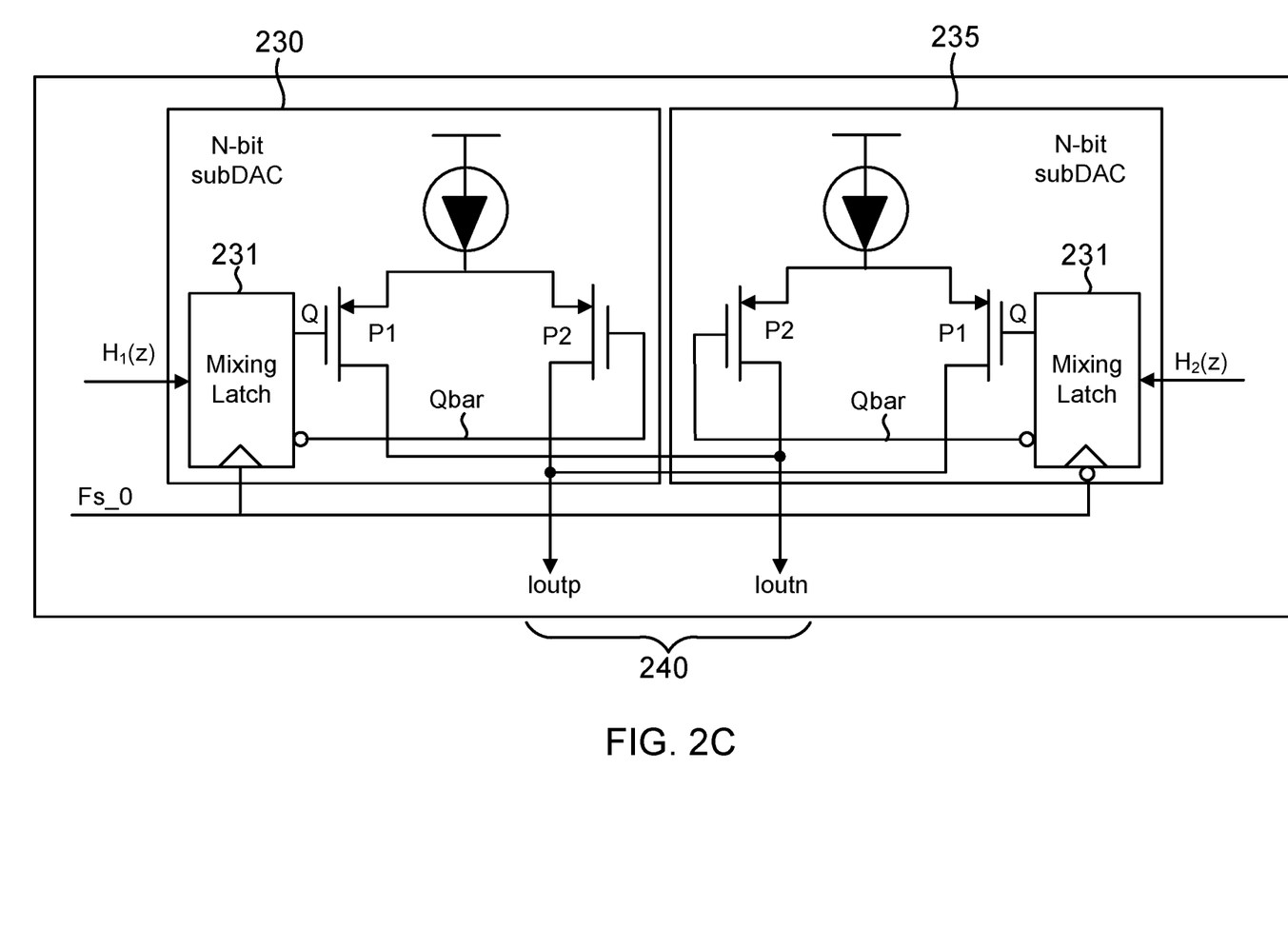
FIG. 2C is a circuit diagram for a current-steering DAC in the RF-DAC transmitter of FIG. 2B.

In a mixed-mode RF-DAC embodiment, DACs 230 and 235 may each be implemented as current-steering RF-DACs as shown in FIG. 2C. The in-phase baseband signal Din_0 is N-bits wide so each current-steering DAC includes N sub-stages (N being a positive integer). In FIG. 2C, only a single current-steering sub-stage is shown in each RF-DAC 230 and 235 for illustration clarity. In the current steering sub-stage for RF-DAC 230, the filtered samples from the $h_1(z)$ FIR impulse response drive a mixing latch 231 clocked by the rising edges of the in-phase LO clock signal Fs_0 to produce a Q and a Q bar output that control the current steering for a differential pair of PMOS transistors P1 and P2. Mixing latches 231 generate the mixed-mode operation for RF-DACs 230 and 235. The current-steering sub-stage for RF-DAC 235 is analogous except that its mixing latch 231 mixes the filtered samples from the $h_2(z)$ FIR impulse response responsive to falling edges of the in-phase LO clock signal fs_0. Subtractor 240 can then simply comprise the connection of the drains for transistors P1 and the connection of the drains for transistors P2. The current from the drains of the transistors P2 form a positive-half (Ioutp) of a differential output current for I channel interpolating DC 205. Similarly, the current from the drains of transistors P1 form the negative-half (Ioutn) of the differential output current for I channel interpolating DAC 205.

Referring again to FIG. 2B, Q channel interpolating DAC 215, I_45 channel interpolating DAC 210, and Q_45 channel interpolating DAC 220 are all constructed analogously as discussed for I channel 205. For example, Q channel interpolating DAC 215 includes a pair of FIR filters 245. A FIR filter having the impulse response $h_1(z)$ in pair 245 filters and interpolates the din_90 baseband input data stream responsive to the rising edges of a quadrature local oscillator clock signal fs_90 to provide a filtered digital signal for up-conversion by an RF-DAC 250. Similarly, another FIR filter having the impulse response $h_2(z)$ in pair 245 filters and interpolates the din_90 baseband input data stream responsive to the falling edges of the quadrature local oscillator clock signal fs_90 to provide a filtered digital signal for up-conversion by an RF-DAC 255. The rising edges of the quadrature local oscillator clock signal clock RF-DAC 250 whereas the falling edges of the quadrature local oscillator clock signal clock RF-DAC 255. An subtractor 260 forms the difference between the RF output signals from RF-DAC 250 and RF-DAC 255 to form the Q channel interpolating DAC RF output signal.

In I_45 channel interpolating DAC 210, a pair of FIR filters 265 filter the din_45 digital baseband input data stream. A FIR filter having the impulse response $h_1(z)$ in pair 265 filters and interpolates the din_45 baseband input data stream responsive to the rising edges of a I_45 (fs_45) local oscillator clock signal to provide a filtered digital signal for up-conversion by an RF-DAC 270. Similarly, another FIR filter having the impulse response $h_2(z)$ in pair 265 filters and 2X interpolates the din_45 baseband input data stream responsive to the falling edges of the I_45 local oscillator clock signal to provide a filtered digital signal for up-conversion by an RF-DAC 275. The rising edges of the I_45 local oscillator clock signal clock RF-DAC 270 whereas the falling edges of the I_45 local oscillator clock signal clock RF-DAC 275. A subtractor 280 forms the difference between the RF output signals from RF-DAC 270 and RF-DAC 275 to form the I_45 channel interpolating DAC RF output signal.

In Q_45 channel interpolating DAC 220, a pair of FIR filters 285 filter and interpolate the din_135 baseband input data stream. A FIR filter having the impulse response $h_1(z)$ in FIR pair 285 filters and interpolates the din_135 baseband input data stream responsive to the rising edges of a Q_45 (fs_135) local oscillator clock signal to provide a filtered digital signal for up-conversion by an RF-DAC 290. Similarly, another FIR filter having the impulse response $h_2(z)$ in FIR pair 285 filters and 2X interpolates the din_135 baseband input data stream responsive to the falling edges of the Q_45 local oscillator clock signal to provide a filtered digital signal for up-conversion by an RF-DAC 295. The rising edges of the Q_45 local oscillator clock signal clock RF-DAC 290 whereas the falling edges of the Q_45 local oscillator clock signal clock RF-DAC 295. A subtractor 299 forms the difference between the RF output signals from RF-DAC 290 and RF-DAC 295 to form the Q_45 channel interpolating DAC RF output signal.

An adder 201 adds the four RF output signals from the four channels to produce a combined RF output signal for transmitter 200. The I_45 local oscillator clock signal fs_45 is delayed in phase by 45 degrees with respect to the in-phase local oscillator clock signal fs_0. Similarly, the Q_45 local oscillator clock signal is delayed in phase by 45 degrees with respect to the quadrature-phase local oscillator clock signal fs_90. The quadrature-phase local oscillator clock signal fs_90 is delayed in phase by 90 degrees with respect to the in-phase local oscillator clock signal fs_0.

Figure 2D:
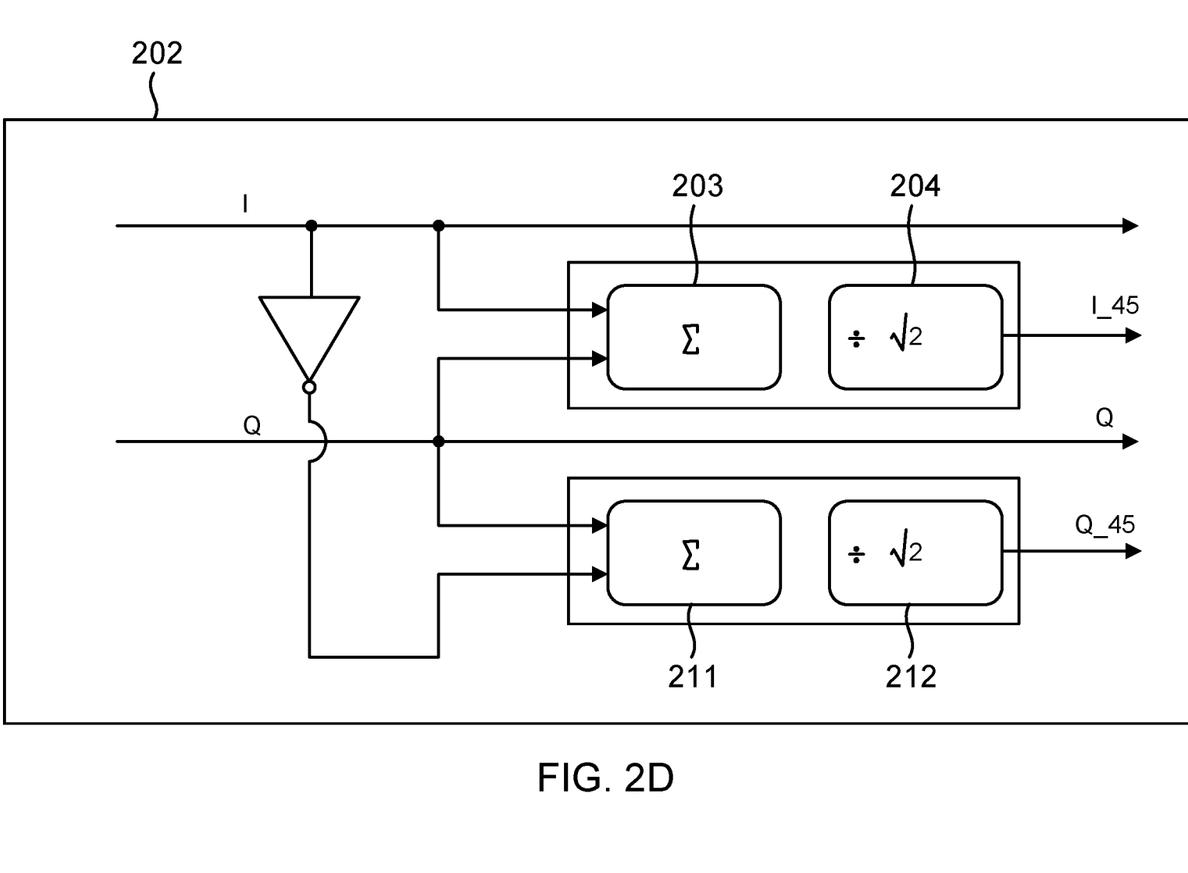
FIG. 2D illustrates a data interpolator for generating an in-phase 45° baseband data stream and a quadrature-phase 45° baseband data stream from the in-phase and quadrature-phase baseband data streams in accordance with an aspect of the disclosure.

A data interpolator 202 for interpolating the I and Q baseband input data streams to produce the I_45 (din_45) and Q_45 (din_135) baseband input data streams is shown in FIG. 2D. Data interpolator 202 includes an adder 203 that sums the I and Q baseband input data streams to produce a sum signal that is then scaled by the square root of two in a multiplier 204 to produce the I_45 baseband input data stream. Similarly, an adder 211 forms the difference between the Q baseband input data stream and the I baseband input data stream to produce a sum signal that is then scaled by the square root of two in a multiplier 212 to produce the Q_45 baseband input data stream.

Figure 3:
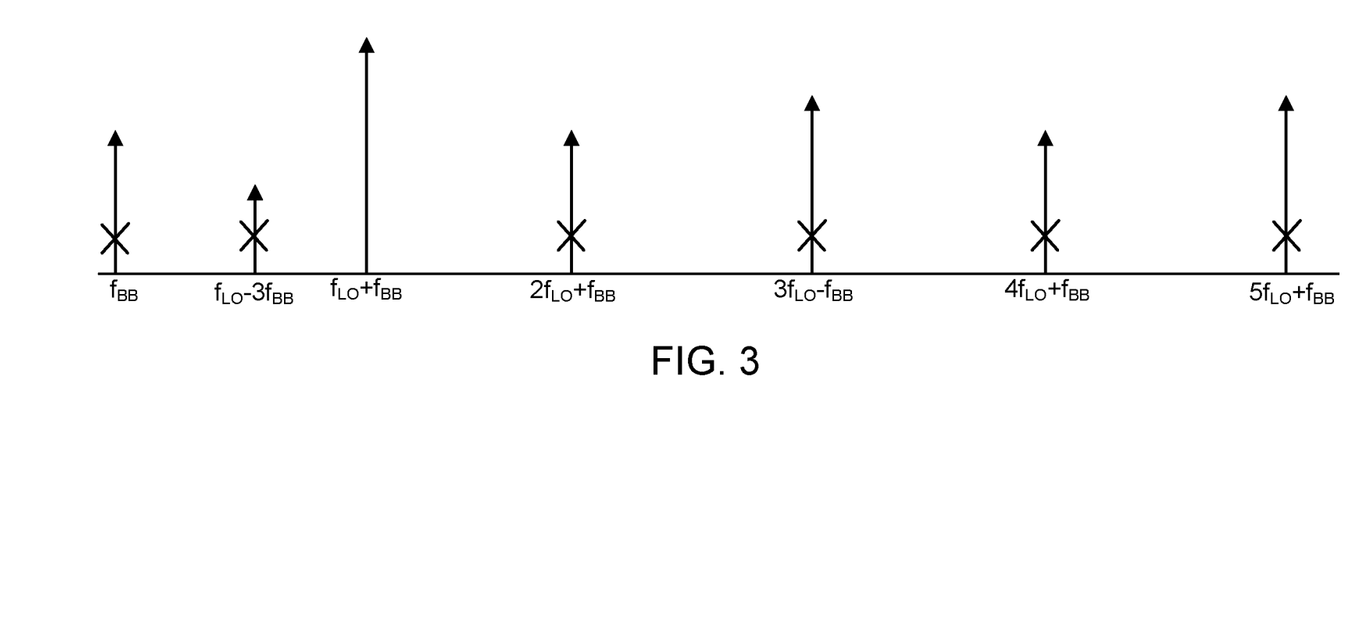
FIG. 3 is an example output spectrum for the RF-DAC transmitter of FIG. 2A.

As noted earlier, the addition of the output signals from the four channels advantageously substantially eliminates the third order distortion of the baseband signal caused by each DAC's non-linearity. An example output spectrum for transmitter 200 is shown in FIG. 3. The baseband signal has a frequency $f_{BB}$ whereas the local oscillator frequency is $f_{LO}$. The desired RF output signal has a frequency of $f_{LO}+f_{BB}$. As shown in FIG. 3, the third order harmonic distortion at $f_{LO}-3f_{BB}$ as well as the odd harmonics of the RF image at $3f_{LO}-f_{BB}$ and $5f_{LO}+f_{BB}$ are cancelled. In addition, the interleaving of the RF-DACs cancels the even RF harmonic image at $2f_{LO}+f_{BB}$, $4f_{LO}+f_{BB}$ (and so on) as well as the baseband image at $f_{BB}$.

Figure 4:
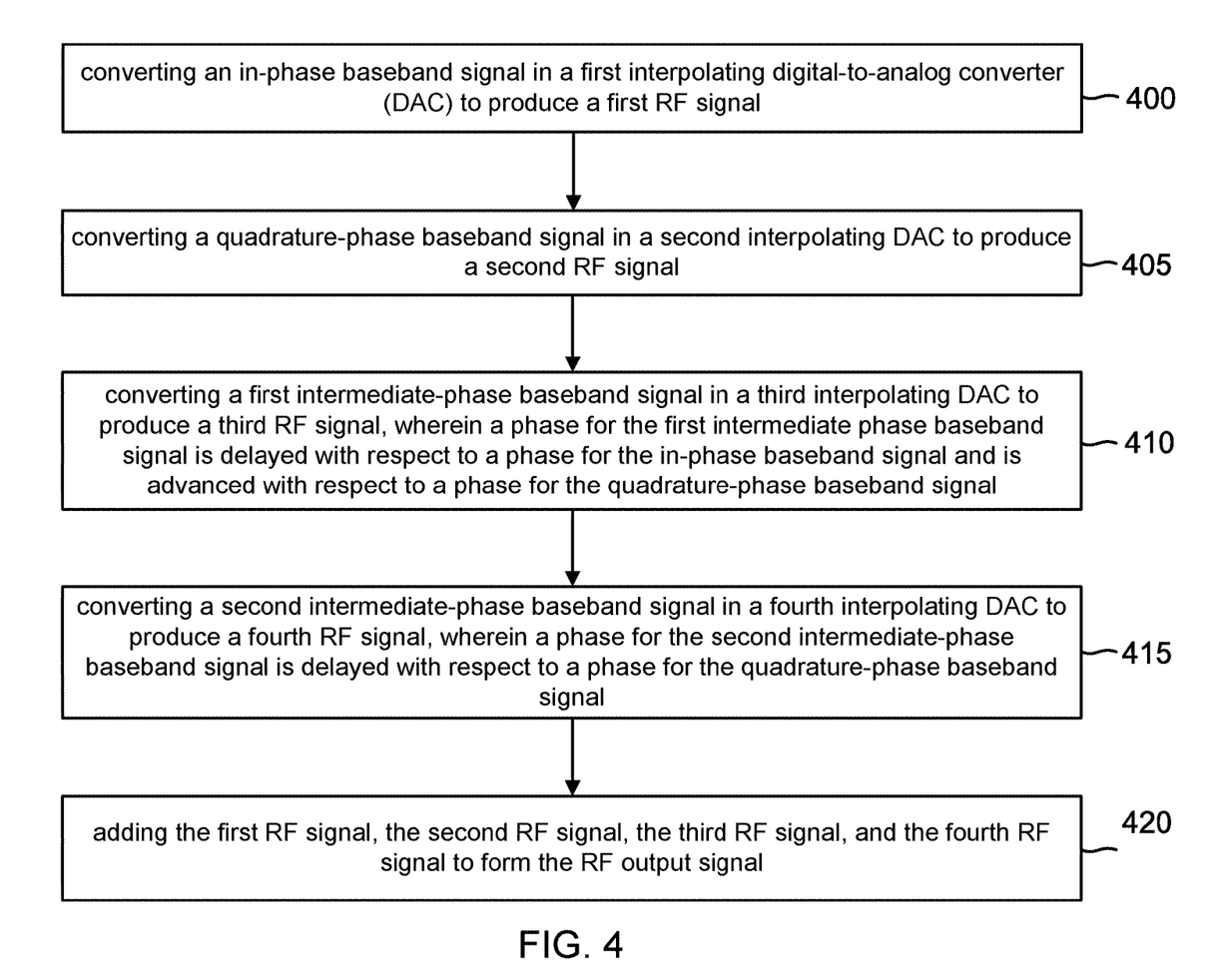
FIG. 4 is a flowchart for a method of operation for an RF-DAC transmitter in accordance with an aspect of the disclosure.

A method of operation for an RF-DAC transmitter will now be discussed with reference to the flowchart shown in FIG. 4. The method begins with an act 400 of converting an in-phase baseband signal in a first interpolating digital-to-analog converter (DAC) to produce a first RF signal. The conversion of the I baseband signal in I channel interpolating DAC 205 is an example of act 400. An act 405 includes converting a quadrature baseband signal in a second interpolating DAC to produce a second RF signal. The conversion of the Q baseband signal in Q channel interpolating DAC 215 is an example of act 405. The method further includes an act 410 of converting a first intermediate-phase baseband signal in a third interpolating DAC to produce a third RF signal, wherein a phase for the first intermediate-phase baseband signal is delayed with respect to a phase for the in-phase baseband signal and is advanced with respect to a phase for the quadrature-phase baseband signal. The I_45 baseband signal is an example of the first intermediate-phase baseband signal. The conversion of the I_45 baseband signal in I_45 channel interpolating DAC 210 is an example of act 410. In addition, the method includes an act 415 of converting a second intermediate-phase baseband signal in a fourth interpolating DAC to produce a fourth RF signal, wherein a phase for the second intermediate-phase baseband signal is delayed with respect to a phase for the quadrature-phase baseband signal. The Q_45 baseband signal is an example of the second intermediate-phase baseband signal. The conversion of the Q_45 baseband signal in Q_45 channel interpolating DAC 220 is an example of act 415. Finally, the method includes an act 420 of adding the first RF signal, the second RF signal, the third RF signal, and the fourth RF signal to form the RF output signal. The operation of adder 201 is an example of act 420.

The RF transmitter disclosed herein may be advantageously incorporated into various electronic systems such as a cellular telephone or smartphone. It will be appreciated that many modifications, substitutions and variations can be made in and to the materials, apparatus, configurations and methods of use of the devices of the present disclosure without departing from the scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

We claim:

1. A radio-frequency digital-to-analog converter (RF-DAC) transmitter, comprising:
   a first interpolating digital-to-analog converter (DAC) configured to convert an in-phase baseband data signal into a first RF signal;
   a second interpolating DAC configured to convert a quadrature baseband data signal into a second RF signal;
   a third interpolating DAC configured to convert a first intermediate phase baseband data signal into a third RF signal, wherein a phase for the first intermediate phase baseband data signal is delayed with respect to a phase for the in-phase baseband data signal and is advanced with respect to a phase for the quadrature baseband data signal; and
   a fourth interpolating DAC configured to convert a second intermediate phase baseband data signal into a fourth RF signal, wherein a phase for the second intermediate phase baseband data signal is delayed with respect to a phase for the quadrature baseband data signal.

2. The RF-DAC transmitter of claim 1, further comprising:
   an adder configured to sum the first RF signal, the second RF signal, the third RF signal, and the fourth RF signal to form an RF output signal.

3. The RF-DAC transmitter of claim 1, wherein the first interpolating DAC includes a first pair of interleaved RF-DACs, the second interpolating DAC comprises a second pair of interleaved RF-DACs, the third interpolating DAC comprises a third pair of interleaved RF-DACs, and the fourth interpolating DAC comprises a fourth pair of interleaved RF-DACs.

4. The RF-DAC transmitter of claim 3, wherein the first pair of interleaved RF-DACS includes a first RF-DAC configured to be clocked by rising edges of an in-phase local oscillator clock signal and includes a second RF-DAC configured to be clocked by falling edges of the in-phase local oscillator clock signal.

5. The RF-DAC transmitter of claim 4, further comprising:
   a first interpolating finite-impulse response (FIR) digital filter configured to filter and interpolate the in-phase baseband data signal into a first filtered data stream, wherein the first RF-DAC is further configured to convert the first filtered data stream to form a first interleaved RF signal, and
   a second interpolating finite-impulse response (FIR) digital filter configured to filter and interpolate the in-phase baseband input data signal into a second filtered data stream, wherein the second RF-DAC is further configured to convert the second filtered data stream to form a second interleaved RF signal; and
   a subtractor configured to form a difference between the first interleaved RF signal and the second interleaved RF signal to form the first RF signal.

6. The RF-DAC transmitter of claim 5, wherein the first FIR digital filter is further configured to be clocked by the rising edges of the in-phase local oscillator clock signal, and wherein the second FIR digital filter is further configured to be clocked by the falling edges of the in-phase local oscillator clock signal.

7. The RF-DAC transmitter of claim 5, wherein a frequency for the in-phase local oscillator clock signal is twice a sampling frequency for the in-phase baseband data signal.

8. The RF-DAC transmitter of claim 3, wherein the first pair of interleaved RF-DACs comprises a first pair of interleaved mixed-mode RF-DACs, the second pair of interleaved RF-DACs comprises a second pair of interleaved mixed-mode RF-DACs, the third pair of interleaved RF-DACs comprises a third pair of interleaved mixed-mode RF-DACs, and the fourth pair of interleaved RF-DACs comprises a fourth pair of interleaved mixed-mode RF-DACs.

9. The RF-DAC transmitter of claim 2, further comprising a power amplifier for amplifying the RF output signal to form an amplified RF output signal.

10. A method for upconverting baseband signals into an RF output signal, comprising:
    converting an in-phase baseband signal in a first interpolating digital-to-analog converter (DAC) to produce a first RF signal;

converting a quadrature-phase baseband signal in a second interpolating DAC to produce a second RF signal;

converting a first intermediate-phase baseband signal in a third interpolating DAC to produce a third RF signal, wherein a phase for the first intermediate-phase baseband signal is delayed with respect to a phase for the in-phase baseband signal and is advanced with respect to a phase for the quadrature-phase baseband signal;

converting a second intermediate-phase baseband signal in a fourth interpolating DAC to produce a fourth RF signal, wherein a phase for the second intermediate-phase baseband signal is delayed with respect to a phase for the quadrature-phase baseband signal; and adding the first RF signal, the second RF signal, the third RF signal, and the fourth RF signal to form the RF output signal.

11. The method of claim 10, wherein:

converting the in-phase baseband signal in the first interpolating digital-to-analog converter (DAC) comprises converting the in-phase baseband signal using a first pair of interleaved RF-DACs;

converting the quadrature baseband signal in the second interpolating DAC to produce a second RF signal comprises converting the quadrature baseband signal using a second pair of interleaved RF-DACs;

converting the first intermediate phase baseband signal in the third interpolating DAC to produce a third RF signal comprises converting the first intermediate phase baseband signal using a third pair of interleaved RF-DACs; and converting the second intermediate phase baseband signal in the fourth interpolating DAC to produce the fourth RF signal comprises converting the second intermediate phase baseband signal using a fourth pair of interleaved RF-DACs.

12. The method of claim 10, further comprising:

interpolating between the in-phase baseband signal and the quadrature-phase baseband signal to produce the first intermediate-phase baseband signal and the second intermediate-phase baseband signal.

13. The method of claim 12, wherein the phase for the first intermediate-phase baseband signal is delayed by 45 degrees with respect to the phase for the in-phase baseband signal, and wherein the phase for the second intermediate-phase baseband signal is delayed by 45 degrees with respect to the phase for the quadrature-phase baseband signal.

14. The method of claim 11, further comprising:

filtering and interpolating the in-phase baseband signal responsive to rising edges of an in-phase local oscillator clock signal to produce a first filtered signal; and filtering and interpolating the in-phase baseband signal responsive to falling edges of the in-phase local oscillator clock signal to produce a second filtered signal, wherein the converting of the in-phase baseband signal using the first pair of interleaved RF-DACs comprises converting the first filtered signal in a first interleaved RF-DAC responsive to the rising edges of the in-phase local oscillator clock signal and converting the second filtered signal in a second interleaved RF-DAC responsive to the falling edges of the in-phase local oscillator clock signal.

15. A radio-frequency digital-to-analog converter (RF-DAC) transmitter, comprising:

an in-phase channel for converting an in-phase baseband signal into a first RF signal;

a quadrature-phase channel for converting a quadrature-phase baseband signal into a second RF signal;

a first intermediate-phase channel for converting a first intermediate-phase baseband signal into a third RF signal, wherein a phase for the first intermediate-phase baseband signal is substantially delayed by 45 degrees with respect to a phase for the in-phase baseband signal; and a second intermediate-phase channel for converting a second intermediate-phase baseband signal into a fourth RF signal, wherein a phase for the second intermediate-phase baseband signal is substantially delayed by 45 degrees with respect to a phase for the quadrature-phase baseband signal, and wherein the in-phase channel, the quadrature-phase channel, the first intermediate-phase channel, and the second intermediate-phase channel each includes a pair of interleaved RF-DACs.

16. The RF-DAC transmitter of claim 15, further comprising an adder for summing the first RF signal, the second RF signal, the third RF signal, and the fourth RF signal to produce an output RF signal for the RF-DAC transmitter.

17. The RF-DAC transmitter of claim 15, wherein the in-phase channel, the quadrature-phase channel, the first intermediate-phase channel, and the fourth intermediate-phase channel each further includes a corresponding pair of digital filters for providing filtered input signals to the channel's pair of interleaved RF-DACs.

18. The RF-DAC transmitter of claim 17, wherein each pair of digital filters comprises a pair of finite impulse response digital filters.

19. The RF-DAC transmitter of claim 15, wherein each pair of interleaved RF-DACs comprises a pair of interleaved mixed-mode RF-DACs.

20. The RF-DAC transmitter of claim 16, further comprising a power amplifier for amplifying the RF output signal to produce an amplified RF output signal.

* * * * *